United States Patent [19]
Rijpers et al.

[11] Patent Number: 5,541,139
[45] Date of Patent: Jul. 30, 1996

[54] METHOD OF MANUFACTURING A RADIATION-EMITTING SEMICONDUCTOR DIODE

[75] Inventors: Johannes C. N. Rijpers; Leonardus J. M. Hendrix, both of Eindhoven, Netherlands

[73] Assignee: U.S. Philips Corporation, New York, N.Y.

[21] Appl. No.: 324,204

[22] Filed: Oct. 17, 1994

[30] Foreign Application Priority Data

Oct. 18, 1993 [BE] Belgium ................................. 09301102

[51] Int. Cl.⁶ .................................................. H01L 21/60
[52] U.S. Cl. ........................ 437/209; 437/126; 437/129; 437/133
[58] Field of Search ..................... 437/209, 129, 437/126, 133, 226, 544; 148/DIG. 95

[56] References Cited

U.S. PATENT DOCUMENTS

| | | | |
|---|---|---|---|
| 4,985,370 | 1/1991 | Ponsee et al. | 437/129 |
| 5,104,824 | 4/1992 | Clausen, Jr. et al. | 437/129 |
| 5,171,706 | 12/1992 | Matsumoto et al. | 437/129 |
| 5,237,639 | 9/1993 | Kato et al. | 437/129 |
| 5,300,452 | 4/1994 | Chang et al. | 437/129 |

FOREIGN PATENT DOCUMENTS

| | | |
|---|---|---|
| 61-116833 | 4/1986 | Japan . |
| 61-070780 | 11/1986 | Japan . |

*Primary Examiner*—Kevin M. Picardat
*Attorney, Agent, or Firm*—Steven R. Biren

[57] ABSTRACT

The invention relates to a method of manufacturing a radiation-emitting semiconductor diode (10) whereby a sacrificial layer (1) comprising a polymer is provided on a first side face (11) of a semiconductor body (20) which contains at least one radiation-emitting semiconductor diode (10), a coating (2) is subsequently provided on the first side face (11) and on a second side face (12) of the semiconductor body (20) which encloses an angle with the first side face (11) and which forms an exit face for the radiation to be generated by the diode (10), after which the first side face (11) is divested of the sacrificial layer (1) and of the portion (21) of the coating (2) situated thereon through etching of the sacrificial layer (1). It is possible by such a method, for example, to cover the mirror faces (11, 14) of a laser diode (10) selectively with a reflecting, anti-reflection, or passivating coating (2). A disadvantage of the known method is that laser diodes (10) manufactured thereby are difficult to solder. According to the invention, this disadvantage is obviated in that a protective layer (3) comprising an inorganic material is provided on the sacrificial layer (1) before the provision of the coating (2) in the method. Such a protective layer (3) prevents damage to the sacrificial layer (1), and thus prevents portions of the coating (2), which cannot be removed anymore, from depositing on the first side face (11) which comprises, for example, a metal layer (7). Preferably, the protective layer (3) comprises a metal, for example aluminium. This also prevents the sacrificial layer (1) from becoming badly soluble owing to UV radiation released in a sputter deposition process of the coating (2). Remainders of the sacrificial layer (1) on the metal layer (7), which also result in bad soldering properties, are avoided thereby. (Laser) diodes thus manufactured have a long useful life and are highly suitable for high-power applications.

10 Claims, 3 Drawing Sheets

METHOD OF MANUFACTURING A RADIATION-EMITTING SEMICONDUCTOR DIODE

BACKGROUND OF THE INVENTION

The invention relates to a method of manufacturing a radiation-emitting semiconductor diode whereby a sacrificial layer comprising a polymer is provided on a first side face of a semiconductor body which contains at least one radiation-emitting semiconductor diode, a coating is subsequently provided on the first side face and on a second side face of the semiconductor body which encloses an angle with the first side face and which forms an exit face for the radiation to be generated by the diode, after which the first side face is divested of the sacrificial layer and of the portion of the coating situated thereon through etching of the sacrificial layer.

A radiation-emitting semiconductor diode thus manufactured has an exit face for radiation which is provided with a coating, such as a layer of high or low reflectivity or a passivating layer, also called a mirror coating in the case of a laser diode. Such (laser) diodes are suitable for many applications such as CD (=Compact DIE), DOR (=Digital Optical Recording), bar code readers and systems for glass fiber communication.

A method of the kind mentioned in the opening paragraph is known from JP(A) 61-70780 published in Patent Abstracts of Japan, vol. 10, no. 240, 19th Aug. 1986. According to the usual methods of providing a coating, such as sputtering, vapor deposition and the like, the coating is provided also on surfaces other than the desired surface of the semiconductor body. Thanks to the use of the sacrificial layer, which comprises a polyimide resin in the known method, a surface of the semiconductor body where no coating is desired, for example the upper surface, is freed from the portion of the coating which has deposited on that surface.

A disadvantage of the known method is that laser diodes manufactured thereby have a starting current which is higher than expected or—in particular in the case of high-power laser diodes—have a comparatively low maximum radiant power.

SUMMARY OF THE INVENTION

The present invention has for its object inter alia to provide a method of the kind mentioned in the opening paragraph whereby radiation-emitting semiconductor diodes are obtained which have a low starting current and a high maximum radiant power.

According to the invention, a method of the kind mentioned in the opening paragraph is for this purpose characterized in that a protective layer of an inorganic material is provided on the sacrificial layer before the coating is provided. A sacrificial layer which comprises an organic polymer on the one hand is very readily provided to an attractive, comparatively great thickness of, for example, one micrometer and on the other hand is also readily removed again after the coating has been provided. It was found in practice that such a layer can be easily damaged by various external influences. Owing to this damage, portions of the coating deposit at the area of the sacrificial layer and can no longer be removed in the subsequent lift-off process. If the first side face of the semiconductor body is formed by a metal layer with which the diode is soldered, the non-removed portions of the coating cause regions where the diode is not or not satisfactorily soldered. A particular result of this is that the heat generated in a laser diode is not removed or not completely removed there. This leads to an increase in the starting current, especially when a laser diode comprises materials which in themselves are comparatively poor heat conductors. But even if a laser diode itself conducts the heat comparatively well, a less good heat removal near the mirror in particular will lead to a comparatively low maximum radiant power. The provision of a protective layer comprising an inorganic material on the sacrificial layer, according to the invention, is found to prevent such damage to the sacrificial layer highly effectively. Owing to a lower adhesion of such a protective layer, which is provided in a dry process, this layer as well as the subjacent sacrificial layer are less liable to be damaged, so that the said problems in the provision of the coating do not or at least substantially not occur. In this manner the advantages of a sacrificial layer comprising an organic polymer, which is provided in usual manner by spinning, are retained while the laser diodes thus manufactured have a comparatively low starting current and a comparatively high maximum radiant power. The protective layer provided in a method according to the invention may be comparatively thin, for example, a few tens of nanometers thick, and may comprise materials such as aluminium oxide or silicon oxide. The protective layer should obviously be provided at a lower temperature than that at which the sacrificial layer decomposes. Similar problems will arise in processes other than the soldering process mentioned above, and the method according to the invention also offers a solution here: when the first side face adjoins a semiconductor layer and an epitaxial layer is provided thereon after the provision of the coating and after removal of the sacrificial layer, this epitaxial layer will not be crystalline or contain many defects at the area of the non-removed portions of the coating, which obviously is undesirable in most cases.

In a major embodiment of a method according to the invention, a photoresist is chosen as the material for the sacrificial layer and a material impermeable to UV radiation is chosen as the material for the protective layer. A photoresist can be provided to the desired thickness very easily, is readily removable and is widely used in the technology of radiation-emitting semiconductor diodes. A protective layer impermeable to UV radiation is of particular advantage when sputtering or other plasma deposition processes are used for the application of the coating. Such processes generate UV radiation whereby—without a protective layer impermeable to UV radiation—further hardening and filamentation of the photoresist would occur. A complete dissolution of the sacrificial layer after the provision of the coating is rendered difficult in that case, which will result in problems similar to those described above in relation to the presence of portions of the coating on the first side face.

Preferably, in a method according to the invention, a metal is chosen as the material of the protective layer. Such a layer offers an excellent protection to the sacrificial layer, both against mechanical damage and against the influence of UV radiation. Particularly favorable results were obtained with an aluminium protective layer. An aluminium layer of approximately 70 nm thickness provided on the sacrificial layer by means of magnetron sputtering was found to be highly satisfactory.

In a preferred embodiment of a method according to the invention, a semiconductor layer structure necessary for forming the radiation-emitting semiconductor diode is provided on a semiconductor substrate, subsequently a metal layer is provided on the lower surface of the substrate or on the upper surface of the semiconductor layer structure, which metal layer forms the first side face of the semiconductor body to be manufactured, then the sacrificial layer comprising a polymer and the protective layer are provided on the metal layer, after which the semiconductor body is formed from the structure thus obtained, preferably by means of cleaving, which semiconductor body is strip-shaped, comprises a number of diodes situated next to one another, and of which a side face forms the second side face of the semiconductor body. After the provision of the coating and the removal of the sacrificial layer, the protective layer, and the portion of the coating situated thereon, the individual diodes are obtained by separation from the strip-shaped semiconductor body. The diodes thus manufactured have a metal layer which has excellent soldering properties and an exit face which is provided with the desired coating. With the use of strips which are one diode wide and which comprise a large number of diodes in longitudinal direction, many diodes can be simultaneously provided with the coating. Thanks to the provision of the sacrificial layer and the protective layer on a plate-shaped substrate before the semiconductor body is formed, the preferred embodiment of the method can be optimally and efficiently carried out.

In one favorable modification of the preferred embodiment mentioned above, the coating is provided by sputtering, while the strip-shaped semiconductor body is so positioned during sputtering that the first side face is substantially perpendicular to the sputtering direction and a third side face of the semiconductor body parallel to the second side face is also covered with the coating during sputtering. Since surfaces extending substantially parallel to the sputtering direction are satisfactorily covered by the sputtered layer in a sputtering process, two side faces, for example the two mirror faces of a laser diode, can be simultaneously provided with the coating by means of this modification. In this modification, the advantage of a protective layer impermeable to UV is at a maximum. This is, first, because UV radiation is released during sputtering and, second, because the sacrificial layer without a protective layer impermeable to UV would have maximum exposure to said UV radiation in this method. The mechanical aspect of the protection is somewhat less here because, at least during the provision of the protective layer, the strip-shaped semiconductor bodies do (must) not make contact with one another. The protection against mechanical damage owing to sticking together during the manufacture and the subsequent manipulation of the strips remains present.

In another modification of the preferred embodiment mentioned above, which is also very favorable, a number of the strip-shaped semiconductor bodies obtained are positioned next to one another, preferably separated from one another by a separation body, such that the first side face is substantially parallel to and the second side face substantially perpendicular to a deposition direction, after which the coating is provided from said direction. The coating may be provided, for example, by sputtering or vapor deposition on the second side face, which then serves as an exit face for radiation. The protective effect of the protective layer here resides mainly, but not exclusively, in the prevention of damage to the sacrificial layer during the formation of the strip-shaped semiconductor bodies, during the subsequent manipulation thereof, and during the positioning against one another or against the separation bodies. A favorable further embodiment of a method according to the invention is characterized in that a laser diode is chosen as the radiation-emitting semiconductor diode wherein the second side face of the semiconductor body forms a mirror face of the laser diode, and a layer acting as a mirror coating is chosen as the coating. Such a coating may comprise, for example, aluminium oxide which is provided, for example, by sputtering. A laser diode equipped with such a mirror coating is eminently suitable for high-power applications.

BRIEF DESCRIPTION OF THE DRAWING

The invention will now be explained in more detail with reference to an embodiment and the accompanying drawing, in which.

The Figures are diagrammatic and not drawn to scale. In particular some of the dimensions in the thickness direction have been exaggerated for the sake of clarity. Corresponding parts have generally been given the same reference numerals in the various Figures.

DESCRIPTION OF THE PREFERRED EMBODIMENTS

Figure 1:
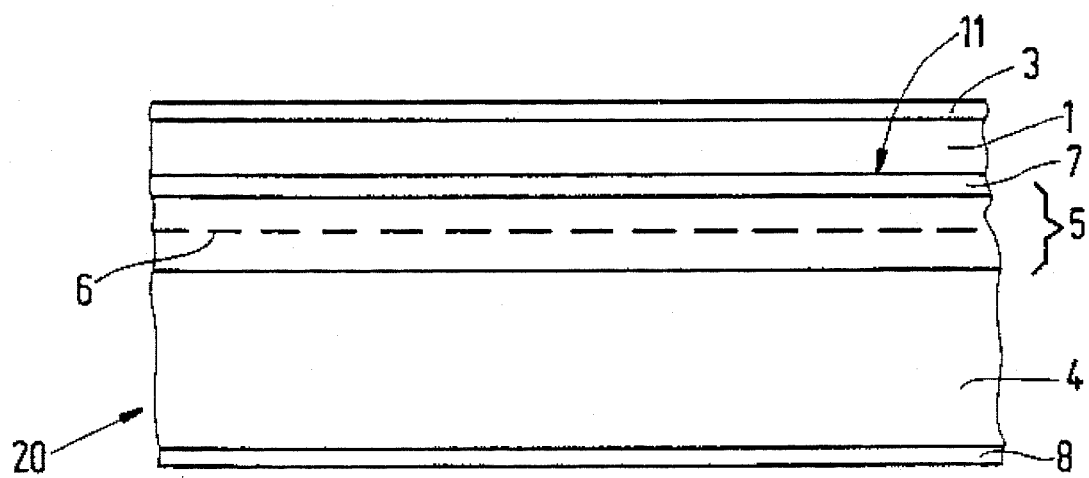
FIGS. 1 to 7 diagrammatically show two embodiments of a method according to the invention for the manufacture of a radiation-emitting semiconductor diode by means of a side elevation, a plan view, and five further side elevations, in consecutive stages of manufacture.
Figure 2:
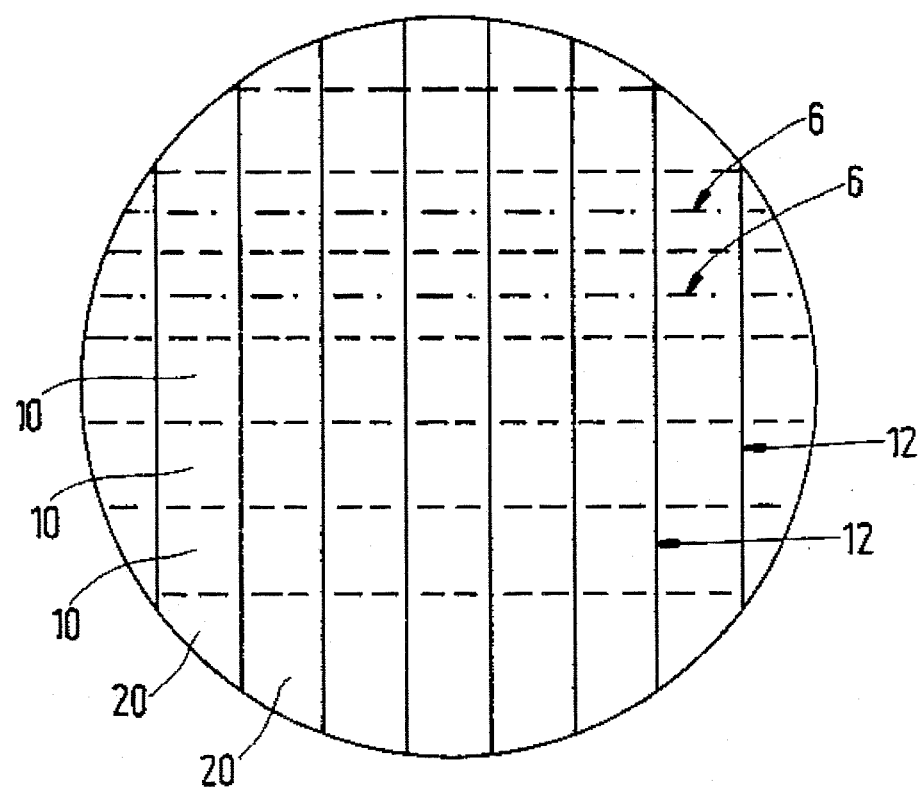
Figure 3:
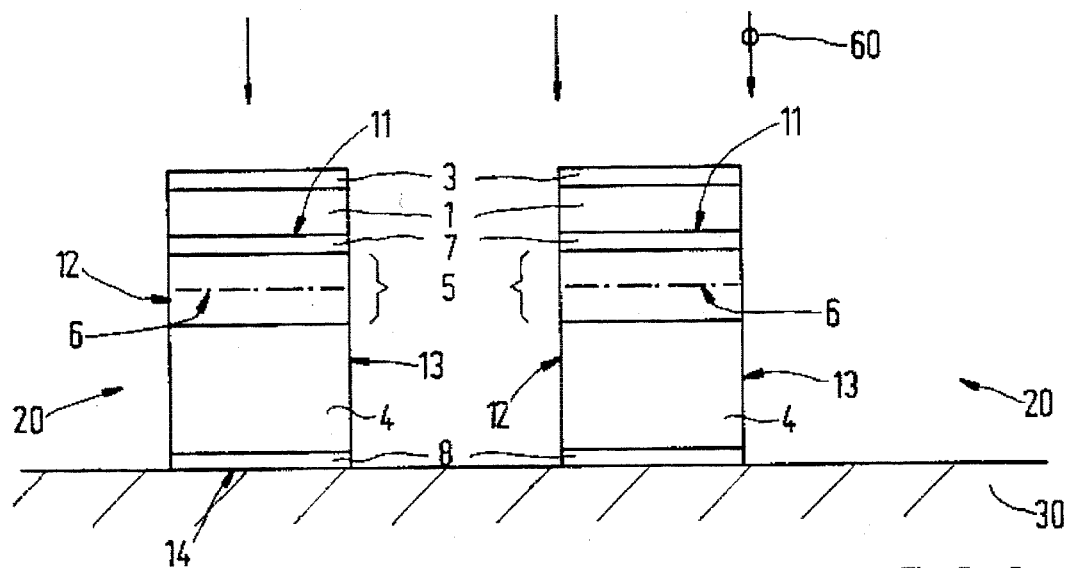
Figure 4:
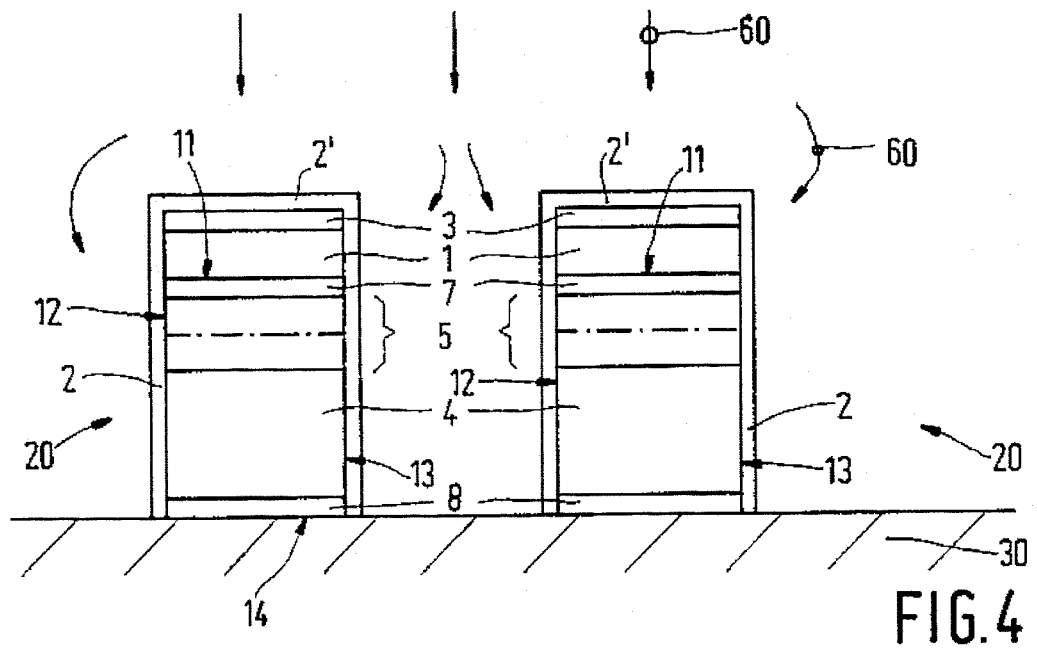
Figure 5:
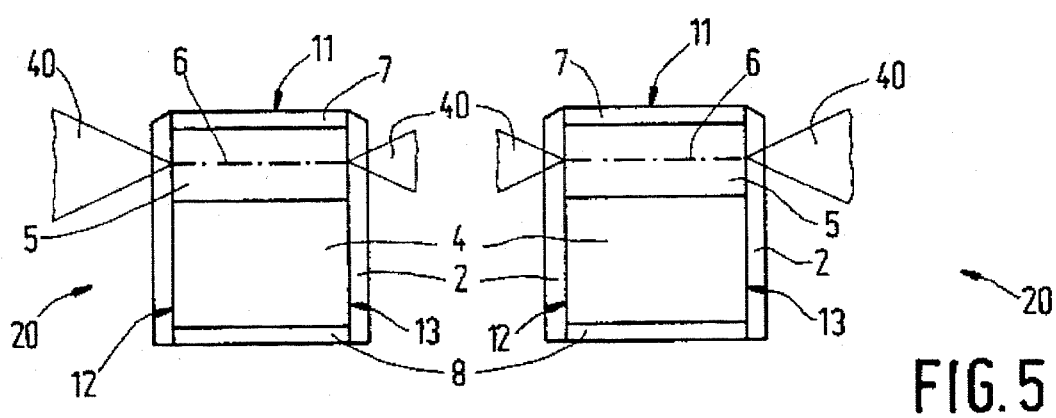

FIGS. 1 to 5 diagrammatically show a first embodiment of a method according to the invention for the manufacture of a radiation-emitting semiconductor diode in a side elevation, a plan view, and three further side elevations, and in consecutive stages of manufacture. A semiconductor layer structure 5 necessary for a radiation-emitting semiconductor diode, here an InGaP/InAlGaP laser diode, is provided on a semiconductor substrate 4 (see FIG. 1), here made of GaAs, for example, by OMVPE (=Organo Metallic Vapor Phase Epitaxy), which structure comprises an active layer between two cladding layers and a contact layer situated on the upper cladding layer, these layers not being depicted separately in the Figures. The semiconductor layer structure also comprises a pn junction situated near the active layer and conventional means by which a strip-shaped active region 6 is formed whose longitudinal direction extends parallel to the plane of the drawing. The pn junction and the said means have not been depicted in the Figures either. Subsequently the lower surface of the substrate 4 or the upper surface of the semiconductor layer structure 5, in this case both surfaces, is provided with a metal layer 7, 8. The metal layer 7 forms a first side face 11 of a semiconductor body 20 to be formed. Then a sacrificial layer 1 comprising an organic polymer, here a Waycoat photoresist no. 204, with a thickness of approximately 1.2 μm is provided on the first side face 11 and baked for two minutes at 90° C.

Then, according to the invention, a protective layer 3 comprising an inorganic material, here a metal, and in this example aluminium, of approximately 70 nm thickness is provided on the sacrificial layer 1. The protective layer 3 is provided by DC (=Differential Current) magnetron sputtering in this case. After that (see FIG. 2) the semiconductor body 20 is formed from the structure thus obtained, here by cleaving, in the form of a strip 20 which comprises a number of laser diodes 10 next to one another. A side face 12 of each strip 20 forms the second side face 12 of the semiconductor body which encloses an angle, here a perpendicular angle, with the first side face 11, an exit face for radiation to be generated within a strip-shaped active region 6 of the diode 10, and which is to be provided with a coating, for example, a mirror coating. In this embodiment, a large number of semiconductor bodies 20 are formed, so that the method is efficient. The method according to this example also prevents the second side face 12, which is to be provided with a coating, from being contaminated with portions of the sacrificial layer 1 or the protective layer 3, because the second side face 12 is not formed until after the sacrificial layer 1 and the protective layer 3 have been deposited.

Subsequently (see FIG. 3) the semiconductor body 20, in this case a large number of semiconductor bodies 20 of which two am depicted in the Figure, is placed on a support 30 in a device for providing the coating, here a sputtering device. This is done such that the first side face 11 is substantially perpendicular to the sputtering direction 60 and the distance between two strip-shaped semiconductor bodies 20 is at least approximately 500 μm.

Then (see FIG. 4) the coating 2, in this example comprising an approximately 0.2 μm thick mirror coating of aluminium oxide, is provided in a sputtering process on the second side face 12, and here also on a third side face 13 parallel thereto of the strip-shaped semiconductor body 20. Thanks to the fact that also the surfaces extending parallel to the sputtering direction 60 are covered in a sputtering process, the two mirror surfaces 12 and 13 of the laser diodes 10 can be covered with the coating 2 in one sputtering process. This is a major advantage. No deposition of the coating 2 takes place here on the side face 14 resting on the support 30. The coating 2 is obviously also provided on the protective layer 3 lying on the first side face 11 of the semiconductor body 20. Since an inorganic protective layer 3 is used, the sacrificial layer 1 is protected against mechanical damage, for example, during manipulation of the semiconductor bodies 20. The absence of such damage means that no portion of the coating 2 will deposit anywhere on the metal layer 7 in the first side face 11, and most certainly not on the portion thereof situated close to the side face 12. The protective layer 3, here made of aluminium, is in addition impermeable to UV radiation so that the sacrificial layer 1, which here comprises a photoresist, is (largely) protected against further filamentation or hardening under the influence of UV radiation generated from the sputtering plasma.

After the strip-shaped semiconductor body has been taken from the sputtering device (see FIG. 5), the sacrificial layer 1 is removed by means of a usual solvent, here with acetone. The protective layer 3 situated on the sacrificial layer 1 and the portion of the coating 2 situated thereon are also removed. The method according to the invention not only prevents during the deposition process of the coating 2 that portions thereof could directly deposit on the metal layer 7, where they could not be removed anymore, but also that during the removal of the sacrificial layer 1 portions thereof remain on the metal layer 7. As a result, the metal layer 7 has excellent soldering properties and the so-called epi-down mounted laser diodes 10 have a long useful life and a comparatively high maximum radiant power 40. The individual laser diodes 10 are finally obtained from the strip-shaped semiconductor body 20 by, for example, chip chopping.

Figure 6:
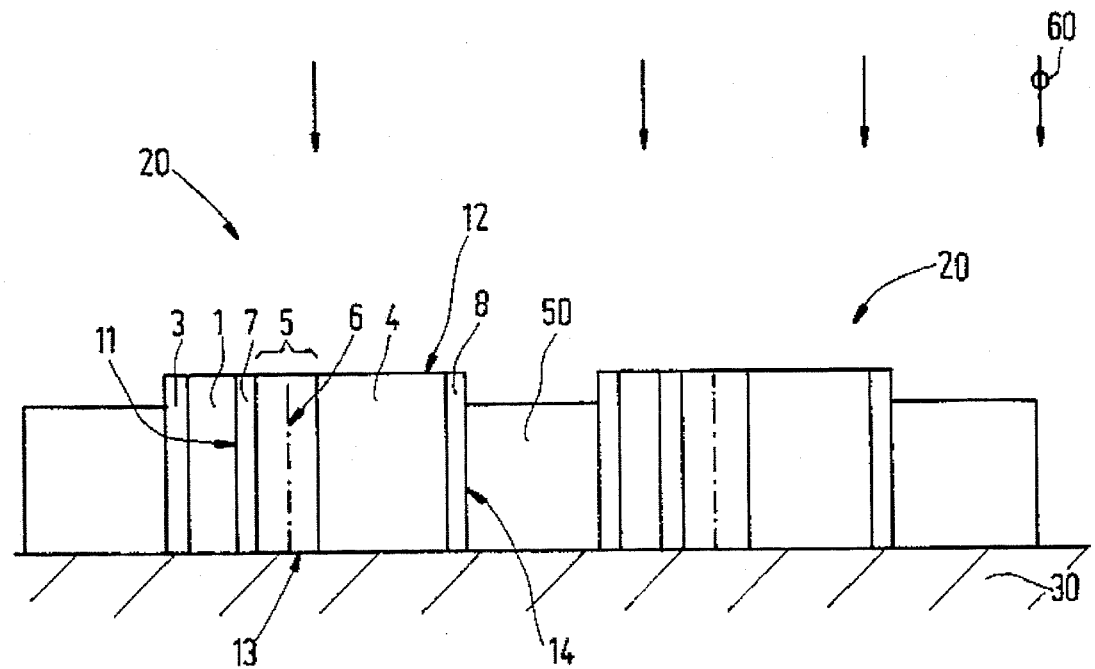
Figure 7:
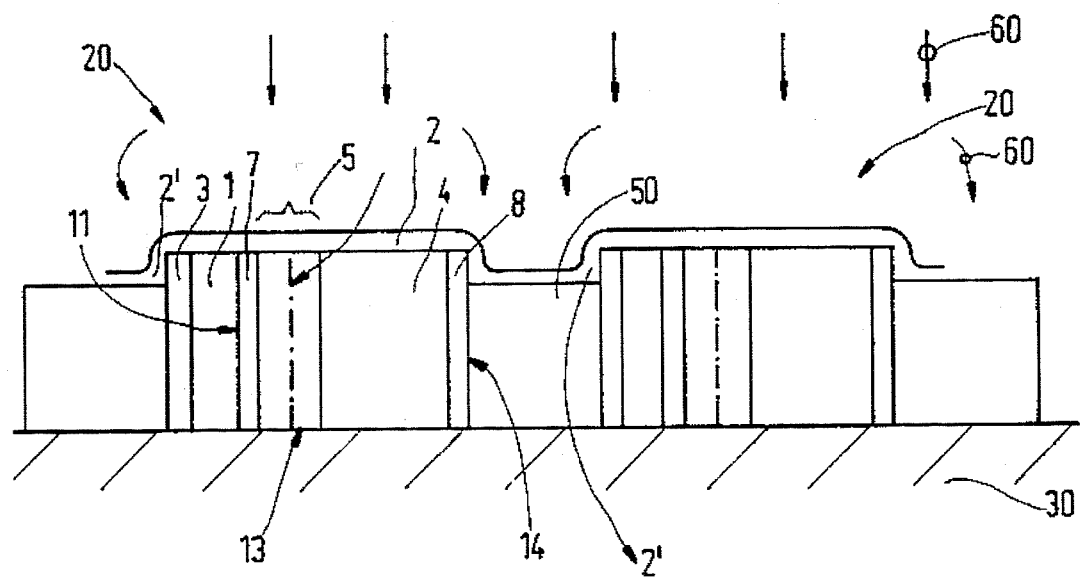

FIGS. 1, 2, 6, 7 and 5 diagrammatically show a second embodiment of a method according to the invention for the manufacture of a radiation-emitting semiconductor diode in a side elevation, a plan view, and three further side elevations, in consecutive stages of manufacture. The first process steps of the method in this example are identical to those of the embodiment described above. For a discussion thereof, reference is made to the description of FIGS. 1 and 2.

After the strip-shaped semiconductor body 20 has been formed (see FIG. 6), the semiconductor body 20, here a large number of semiconductor bodies 20 of which two have been shown in the Figure, is placed on a support 30 in a device for providing the coating 2, here again a sputtering device. This is done such that the first side face 11, and here also a third side face 14 extending parallel to the first side face 11, will be approximately parallel to and the second side face 12 will be approximately perpendicular to a direction 60 from which the coating 2 will be provided. The strip-shaped semiconductor bodies 20 are mutually separated by means of a strip-shaped separation body 50 which comprises GaAs and is 300 μm wide.

Then (see FIG. 7) the coating 2 is provided on the second side face 12 of the strip-shaped semiconductor body 20 by sputtering, which coating in this case comprises an approximately 0.2 μm thick aluminium oxide mirror coating layer. Since surfaces extending substantially parallel to the sputtering direction 60 are also coated in a sputtering process, as was noted above, portions of the first side face 11 and of a third side face 14 parallel thereto are also covered with the coating 2 here. The side face 13 of the semiconductor body 20 resting on the support 30 is not covered with the coating 2 in this example. Owing to the fact that a sacrificial layer 1 and an inorganic protective layer 3 situated thereon are used for the first side face 11, the sacrificial layer 3 is protected against mechanical damage which may arise especially during manipulation of the strip-shaped semiconductor body 20. Thanks to the absence of such damage, no part of the coating 2 will be deposited directly on the metal layer 7 on the first side face 11, and definitely not near the side face 12. The inorganic protective layer 3, made of aluminium as it was in the first example, is not easily damaged. Since the protective layer 3 in this example is impermeable to UV radiation, moreover, the sacrificial layer 1 comprising a photoresist here is protected to a certain extent against further filamentation or hardening under the influence of the UV radiation generated in the sputtering process also in this embodiment. After this first sputtering process, the strip-shaped semiconductor bodies 20 are turned over on the support 30, so that the side face 13 in FIG. 6 takes up the position of the side face 12. A second sputtering process is then used in a similar manner for providing, for example, a reflecting coating 2 (not shown in FIG. 6) on the side face 13. This reflecting coating 2 also comprises aluminium oxide and has a thickness as desired for the reflecting action.

After the strip-shaped semiconductor body 20 has now been taken from the sputtering device, the sacrificial layer 1 is removed (see FIG. 5) by means of a usual solvent, in this case acetone. The protective layer 3 present on the sacrificial layer 1 and the portion of the coating 2 lying on top of that assembly are also removed during this. The method according to the invention not only prevents that during the deposition process of the coating 2 portions thereof are applied directly to the metal layer 7, where they could not be removed anymore, but also prevents that portions of the sacrificial layer remain on the metal layer 7 during the removal of this sacrificial layer 1. This prevents problems, for example, during soldering of the metal layer 7. Thanks to good soldering properties of the metal layer 7, the epi-down mounted laser diodes of this embodiment have a long operational life also when the emerging radiation 40 has a comparatively high power. The fact that a portion of the coating 2 is deposited on a portion of the side face 14, i.e. the portion adjacent the mirror face 12, and accordingly on a portion of the metal layer 8 is not a drawback in this case. This is because the laser diodes 10 manufactured by the method according to this embodiment are destined for epi-down mounting on the first side face 11. Such a mounting method is desirable in particular for high-power applications where a good heat removal is essential. The use of a reflecting coating 2 on one of the two mirror faces 12, 13 of the laser 10, here on face 13, aims at high-power applications. It suffices in that case to provide a wire connection on the third side face 14, for which the portions of the coating 2 near the edges of the side face 14 form no disadvantage.

The invention is not limited to the embodiments given because many modifications and variations are possible to those skilled in the an within the scope of the invention. Thus it is possible to manufacture LEDs (=Light Emitting Diodes) instead of laser diodes. The material system in which the radiation-emitting semiconductor diode is manufactured may be instead of InGaP/InAlGaP also GaAs/AlGaAs or InGaAsP/InP, or alternative material systems such as the II–VI material system.

It is noted, that instead of the first side face, alternatively a side face of the semiconductor body parallel thereto may be coated with a sacrificial layer provided with a protective layer, for example, for the purpose of a final mounting whereby a diode is soldered at the substrate side. Obviously, if so desired, two parallel side faces, for example the upper face and the lower face of the semiconductor body, may alternatively be covered with a sacrificial layer and a protective layer.

It is further noted that alternative techniques such as vapor deposition or CVD (=Chemical Vapor Deposition) may be used for providing the coating. The coating may comprise besides insulating materials also semiconductor or conductor materials.

We claim:

1. A method of manufacturing a radiation-emitting semiconductor diode (10) whereby a sacrificial layer (1) comprising a polymer is provided on a first side face (11) of a semiconductor body (20) which contains at least one radiation-emitting semiconductor diode (10), a coating (2) is subsequently provided on the first side face (11) and on a second side face (12) of the semiconductor body (20) which encloses an angle with the first side face (11) and which forms an exit face for the radiation to be generated by the diode (10), after which the first side face (11) is divested of the sacrificial layer (1) and of the portion (2') of the coating (2) situated thereon through etching of the sacrificial layer (1), characterized in that a protective layer (3) of an inorganic material is provided on the sacrificial layer (1) before the coating (2) is provided.

2. A method as claimed in claim 1, characterized in that a photoresist is chosen as the material for the sacrificial layer (1) and a material impermeable to UV radiation is chosen as the material for the protective layer (3).

3. A method as claimed in claim 1, characterized in that a metal is chosen as the material of the protective layer (3).

4. A method as claimed in claim 3, characterized in that aluminium is chosen as the metal.

5. A method as claimed in claim 1, characterized in that a semiconductor layer structure (5) for forming the radiation-emitting semiconductor diode (10) is provided on a semiconductor substrate (4), subsequently a metal layer (7, 8) is provided on at least one of the lower surface of the substrate (4) and on the upper surface of the semiconductor layer structure (5), said metal layer (7, 8) forming the first side face (11) of the semiconductor body (20) to be manufactured, then the sacrificial layer (1) comprising a polymer and the protective layer (3) are provided on the metal layer (7, 8), after which the semiconductor body (20) is formed from the structure thus obtained, the semiconductor body comprising a plurality of diodes (10) situated next to one another, and a side face thereof forming the second side face.

6. A method as claimed in claim 5, characterized in that the coating (2) is provided by sputtering, and the strip-shaped semiconductor body (20) is so positioned during sputtering that the first side face (11) is substantially perpendicular to the sputtering direction (60) and a third side face (13) of the semiconductor body (20) parallel to the second side face (12) is also covered with the coating (2) during sputtering.

7. A method as claimed in claim 5, characterized in that the strip-shaped semiconductor body (20) provided with the sacificial layer (1) and the protective layer (3) is positioned next to another, identical semiconductor body (20), such that the first side face (11) is substantially parallel to and the second side face (12) substantially perpendicular to a direction (60) from which the coating (2) is to be provided, after which the coating (2) is provided.

8. A method as claimed in claim 1, characterized in that a semiconductor laser diode (10) is chosen as the radiation-emitting semiconductor diode (10), wherein the second side face (12) of the semiconductor body (20) forms a mirror face of the semiconductor laser diode (10), and the coating (2) forms a mirror coating of the semiconductor laser diode (10).

9. A method as claimed in claim 5, characterized in that the semiconductor body (20) is formed from the structure by cleaving.

10. A method as claimed in claim 7, characterized in that the semiconductor body (20) is separated from the identical semiconductor body (20) by a separation body (50).

\* \* \* \* \*